(12) United States Patent
Chen et al.

(10) Patent No.: US 12,733,500 B2
(45) Date of Patent: Sep. 8, 2026

(54) SEAL STRUCTURES INCLUDING PASSIVATION STRUCTURES

(71) Applicant: Taiwan Semiconductor Manufacturing Company, Ltd., Hsinchu (TW)

(72) Inventors: Chun Yu Chen, Hsinchu (TW); Yen Lian Lai, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 862 days.

(21) Appl. No.: 17/703,668

(22) Filed: Mar. 24, 2022

(65) Prior Publication Data

US 2023/0026785 A1 Jan. 26, 2023

Related U.S. Application Data

(60) Provisional application No. 63/224,598, filed on Jul. 22, 2021.

(51) Int. Cl.
*H10W 42/00* (2026.01)
*H10W 20/42* (2026.01)
*H10W 74/10* (2026.01)

(52) U.S. Cl.
CPC ......... *H10W 42/121* (2026.01); *H10W 20/42* (2026.01); *H10W 74/147* (2026.01)

(58) Field of Classification Search
CPC ............. H01L 23/3192; H01L 23/5226; H01L 23/5389; H01L 23/585; H10W 20/42; H10W 42/121; H10W 74/147
See application file for complete search history.

(56) References Cited

U.S. PATENT DOCUMENTS 9,627,332 B1 * 4/2017 Liang .................... H10W 42/00
10,727,218 B2 7/2020 Wu et al.
2011/0241178 A1 * 10/2011 Miki .................... H01L 23/585 257/E23.116
2012/0104541 A1 * 5/2012 Chiu .................. H10W 74/147 257/508
2017/0186732 A1 * 6/2017 Chu .................... H01L 23/5226
(Continued)

FOREIGN PATENT DOCUMENTS

TW 201208012 A 2/2012
TW 201839870 A 11/2018
TW 201926408 A 7/2019

*Primary Examiner* — Yara B Green
*Assistant Examiner* — Christopher M Roland
(74) *Attorney, Agent, or Firm* — HAYNES AND BOONE, LLP

(57) ABSTRACT

Integrated circuit (IC) chips and seal ring structures are provided. An IC chip according to the present disclosure includes a substrate that has a device region and a ring region surrounding the device region, an interconnect structure disposed on the substrate, a first passivation layer disposed over the interconnect structure, a first contact via ring embedded in the first passivation layer, a first contact pad ring disposed on the first contact via ring and the first passivation layer, a second passivation layer disposed over the first contact pad ring, and a polymer layer disposed on a portion of the second passivation layer. The first contact via ring and the first contact pad ring completely surround the device region.

20 Claims, 9 Drawing Sheets

(56) References Cited

U.S. PATENT DOCUMENTS

| | | | | |
|---|---|---|---|---|
| 2018/0315723 | A1* | 11/2018 | Singh | H01L 24/06 |
| 2022/0051993 | A1* | 2/2022 | Chen | H10W 42/00 |
| 2023/0036317 | A1* | 2/2023 | Chen | H10W 42/00 |
| 2023/0154870 | A1* | 5/2023 | Chen | H01L 23/585<br>257/584 |
| 2025/0079346 | A1* | 3/2025 | Kuo | H10W 42/00 |
| 2026/0107774 | A1* | 4/2026 | Chen | H10W 42/00 |

* cited by examiner 200
106-2
1040
1922
1902
1020
186
106-1
X
θ
θ
X
106-3
104
106-4
Y
Z
X
106-1
106-2
106-3
106-4
106

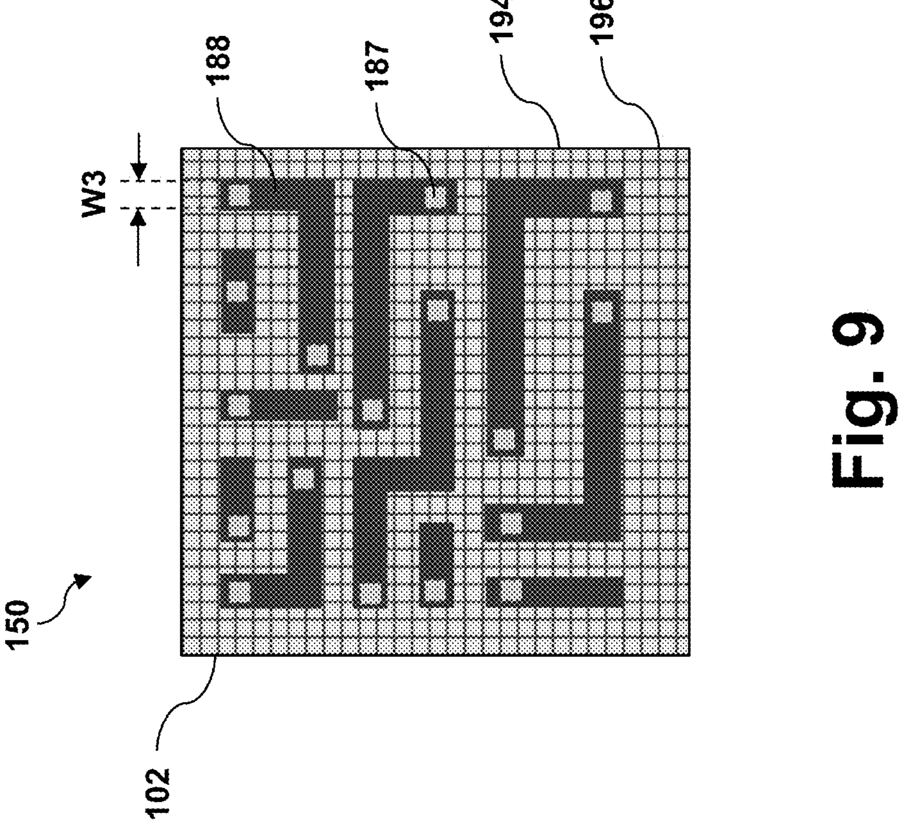
Fig. 9

SEAL STRUCTURES INCLUDING PASSIVATION STRUCTURES

PRIORITY DATA

This application claims priority to U.S. Provisional Patent Application Ser. No. 63/224,598, filed Jul. 22, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Structures of the transistors may be susceptible to damages due to mist ingress or stress during singulation. Seal structures have been implemented to protect semiconductor devices. While existing seal structures are generally satisfactory for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9 illustrates an enlarged fragmentary top view of a portion of the interconnect structure disposed over a device region of the substrate in FIG. 1, according to one or more aspects of the present disclosure.

DETAILED DESCRIPTION

Figure 1:
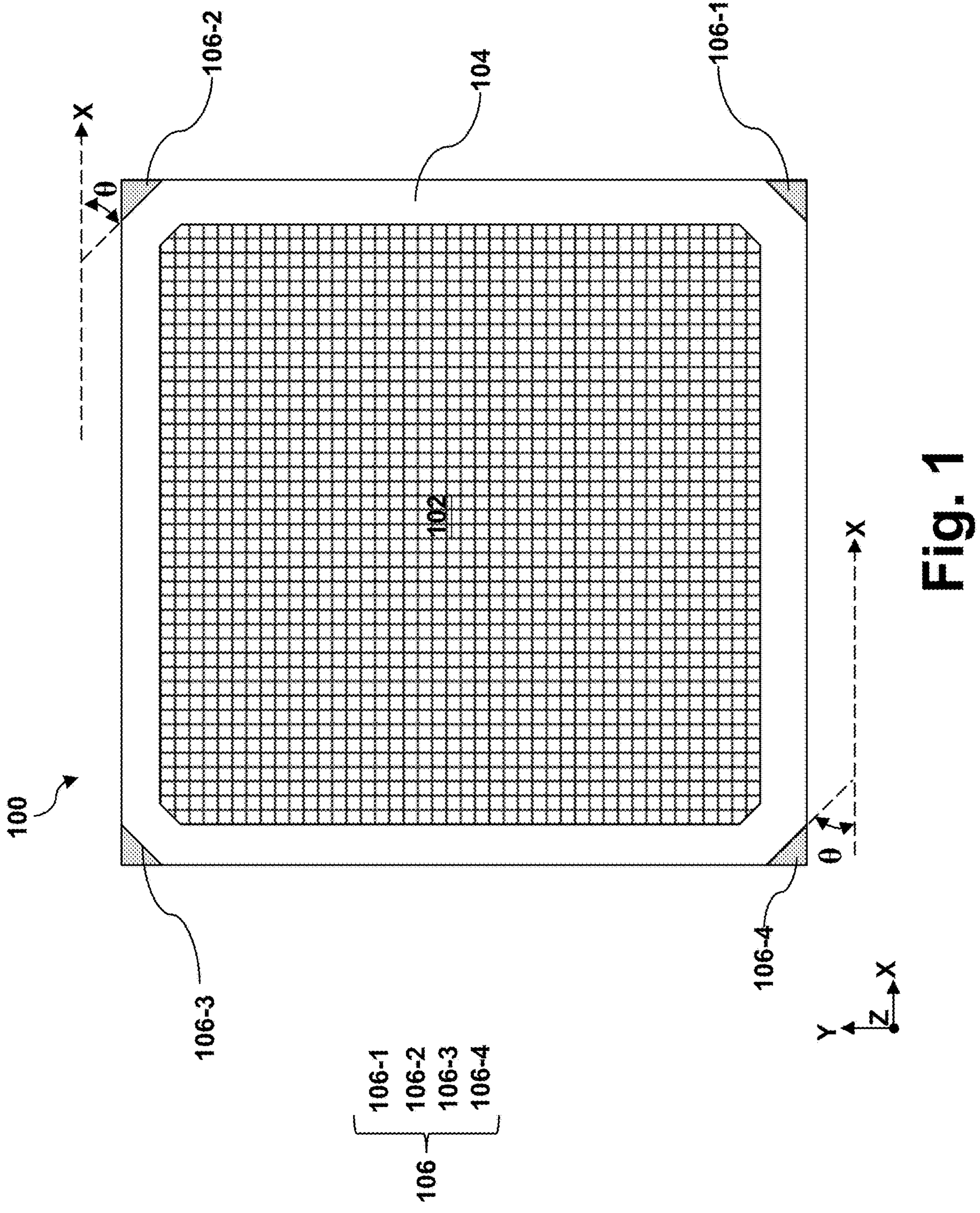
FIG. 1 illustrates a top view of a substrate, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed. For avoidance of doubts, the X, Y and Z directions in figures of the present disclosure are perpendicular to one another. Throughout the present disclosure, like reference numerals denote like features, unless otherwise excepted.

Seal structures are used to prevent semiconductor devices in an integrated circuit (IC) chip from being damaged due to mist ingress or stress generated during singulation of the IC chip. Semiconductor devices being protected by seal structures may include planar devices and multi-gate devices. Planar devices include a semiconductor body embedded in a dielectric layer and a gate structure that engages one surface of the semiconductor body. Multi-gate devices, such as FinFETs and MBC transistors, include one or more semiconductor bodies rising above a substrate and a gate structure that engages three or more surfaces of the one or more semiconductor bodies. Seal ring structures may be present in the front-end-of-line (FEOL) structures, the middle-end-of-line (MEOL) structures, or in back-end-of-line (BEOL) structures. As used herein, FEOL structures include structural features of transistors or other semiconductor devices fabricated on a semiconductor substrate; MEOL structures include source/drain contact vias or gate contact vias; and BEOL structure include interconnect structures, which include passivation structures around top contact pads.

The present disclosure provides embodiments of an IC chip that includes passivation structures as part of in its seal ring structure. According to embodiments of the present disclosure, the IC chip includes a substrate, an interconnect structure disposed on the substrate, and a passivation structure disposed on the interconnect structure. The substrate includes a device region and a ring region surrounding the device region. The device region includes functional semiconductor devices and the seal region includes sealing structures or parts thereof. The interconnect structure includes a first region directly over the device region and a second region directly over the ring region. The passivation structure includes passivation layers, pad structures and a polymer layer. A first passivation layer is disposed over the interconnect structure. A second passivation layer is disposed over the first passivation layer. A polymer layer is disposed over an inner portion of the second passivation layer but not an outer portion of the second passivation layer. The pad structures are embedded in the first passivation layer and the second passivation. The pad structures in the second region extend completely around the first region.

Reference is first made to FIG. 1, which is a top view of a substrate 100. The substrate 100 includes a device region 102, a ring region 104 continuously surrounding the device region 102, and four corner areas 106 disposed at outer corners of the ring region 104. The corner areas 106 include a first corner area 106-1, a second corner area 106-2, a third corner area 106-3, and a fourth corner area 106-4. For ease of reference, the first corner area 106-1, the second corner area 106-2, the third corner area 106-3, and the fourth corner area 106-4 may be collectively or respectively referred to as corner areas 106. The substrate 100, the device region 102, and the ring region 104 may be substantially rectangular when viewed along the Z direction from the top. Each of the corner areas 106 has a shape of a right triangle. In the embodiments represented in FIG. 1, each of the right triangles in the corner areas 106 is an isosceles triangle. In other words, the hypotenuse of each of the corner areas 106 forms an angle θ with the X direction or the Y direction. The angle θ may be about 45°. In the depicted embodiments, the device region 102 includes four cut-off corners that includes an edge parallel to the hypotenuse of the adjacent corner area 106. The ring region 104, while being largely rectangular in shape, is disposed between and engages the corner areas 106 and the device region 102. That is, the ring region 104 includes cut-off outer corners that correspond to the corner areas 106 and push-out inner corners that correspond to the four corners of the device region 102.

In some embodiments, the substrate 100 may be a bulk silicon (Si) substrate. Alternatively, substrate 100 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, the substrate 100 includes one or more group III-V materials, one or more group II-VI materials, or combinations thereof. In still some instances, the substrate 100 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 100 may be diamond substrate or a sapphire substrate.

The substrate 100 may include various semiconductor structures, such as active regions, gate structures disposed over channel regions of the active regions, source/drain features disposed over source/drain regions of the active regions, source/drain contacts disposed over source/drain features, and gate contact vias disposed over the gate structures. The active regions may include silicon (Si) or a suitable semiconductor material, such as germanium (Ge) or silicon germanium (SiGe). Each of the segmented gate structures includes a gate dielectric layer and a gate electrode layer over the gate dielectric layer. In some embodiments, the gate dielectric layer includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed using ALD, PVD, CVD, e-beam evaporation, or other suitable process.

Source/drain features may include silicon (Si) doped with an n-type dopant, such as phosphorus (P) or arsenic (As) or silicon germanium (SiGe) doped with a p-type dopant, such as boron (B) or boron difluoride ($BF_2$). The sourced/drain contacts may include a barrier layer, a silicide layer, and a metal fill layer disposed over the silicide layer. The barrier layer may include titanium nitride or tantalum nitride and functions to prevent electro-migration in the metal fill layer. The silicide layer may include titanium silicide, tantalum silicide, cobalt silicide, nickel silicide, or tungsten silicide. The silicide layer is disposed at the interface between the metal fil layer and the source/drain features to reduce contact resistance. The metal fill layer may include ruthenium (Ru), copper (Cu), nickel (Ni), cobalt (Co), or tungsten (W).

Figure 2:
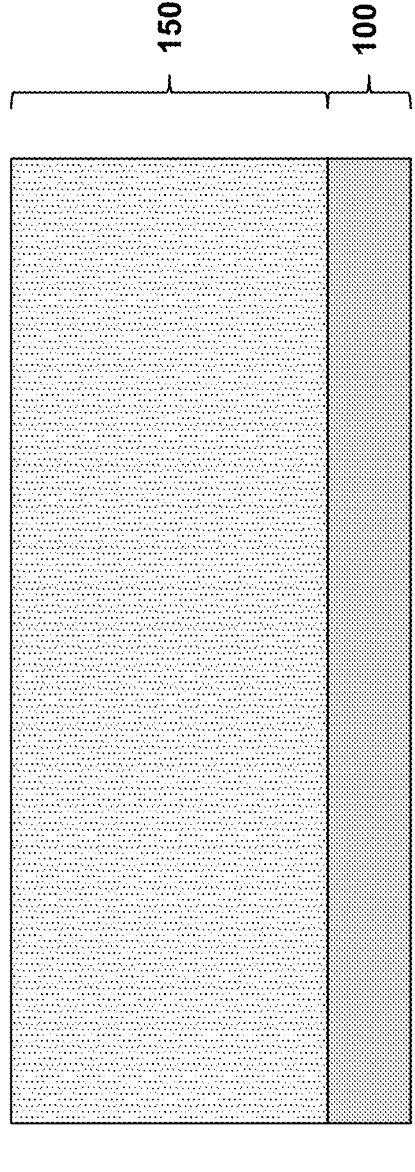
FIG. 2 illustrates a cross-sectional view of an integrated circuit (IC) chip including the substrate in FIG. 1 and an interconnect structure disposed thereon, according to one or more aspects of the present disclosure.
Figure 2:
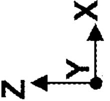

FIG. 2 illustrates a cross-sectional view of an integrated circuit (IC) chip 200 that includes the substrate 100 in FIG. 1 and an interconnect structure 150 disposed thereon. The interconnect structure 150 may include 9 to 14 metal layers. In the depicted embodiment, the interconnect structure 150 includes 9 metal layers. Each of the metal layers includes conductive lines embedded in an intermetal dielectric (IMD) layer. The interconnect structures 150 also includes contact vias that vertically interconnect conductive lines in different metal layers. The IMD layer may include materials such as tetraethylorthosilicate (TEOS) oxide, un-doped silicate glass, or doped silicon oxide, borophosphosilicate glass (BPSG), fused silica glass (FSG), phosphosilicate glass (PSG), boron doped silicon glass (BSG), silicon oxycarbide, and/or other suitable dielectric materials. The conductive lines and contact vias may include copper (Cu), titanium nitride (TiN), tungsten (W), or ruthenium (Ru). The interconnect structure 150 functionally connects semiconductor devices in the substrate 100. While not explicitly shown in FIG. 2, the interconnect structure 150 may include a plurality of contact pads to allow electrical connection to the IC chip 200. The plurality of contact pads are embedded in one or more passivation layers and at least one polymer layer. As will be described further below, embodiments of the present disclosure include one or more pad structures as part of the seal ring structures to protect the semiconductor devices or functional interconnection connected thereto.

The semiconductor structures in the substrate 100 may include transistors, such as planar transistors or multi-gate transistors, or passive devices. Planar transistors include a semiconductor body embedded in a dielectric layer and a gate structure engages one surface of the semiconductor body. Examples of multi-gate transistors may include fin-like field effect transistors (FinFETs) and multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. When transistors in the substrate 100 are FinFETs, the active regions may include fin-like semiconductor structures rising above an isolation feature and the gate structures are disposed over the fin-like semiconductor structures to engage two or three surfaces of the fin-like semiconductor structures. When transistors in the substrate 100 are MBC transistors, the active regions may each include a vertical stack of nanostructures and the gate structure wraps around each of nanostructures in the vertical stack of nanostructures. The nanostructures may have different cross-sections. In some instances, the nanostructures have a width substantially similar to its thickness and may be referred to as nanowires. In some other instances, the nanostructures have a width greater than to its thickness and may be referred to as nanosheets.

Figure 3:
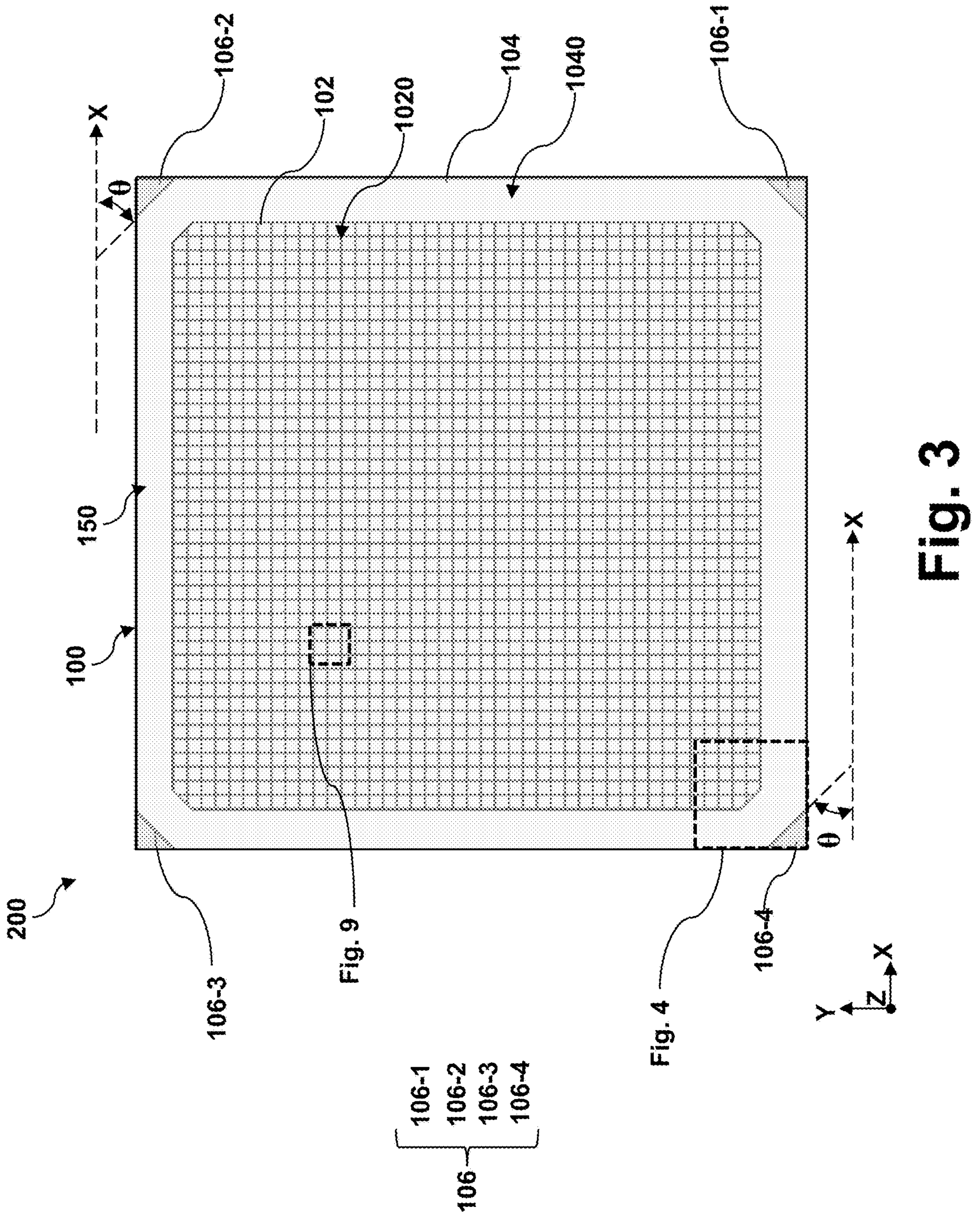
FIG. 3 illustrates a top view of the IC chip of FIG. 2, according to one or more aspects of the present disclosure.
Figure 4:
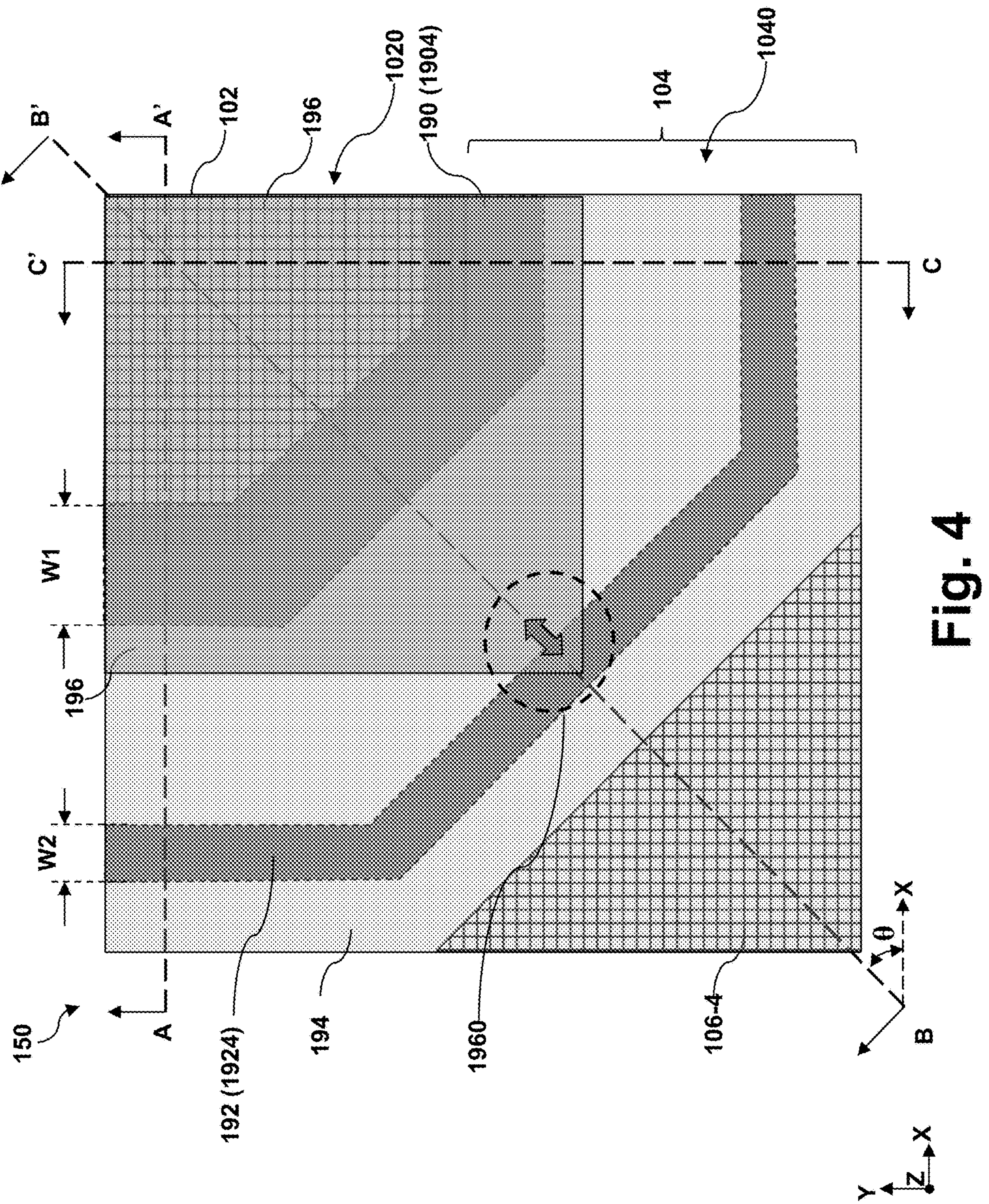
FIG. 4 illustrates an enlarged fragmentary top view of a portion of the interconnect structure disposed over a corner area of the substrate in FIG. 1, according to one or more aspects of the present disclosure.
Figure 5:
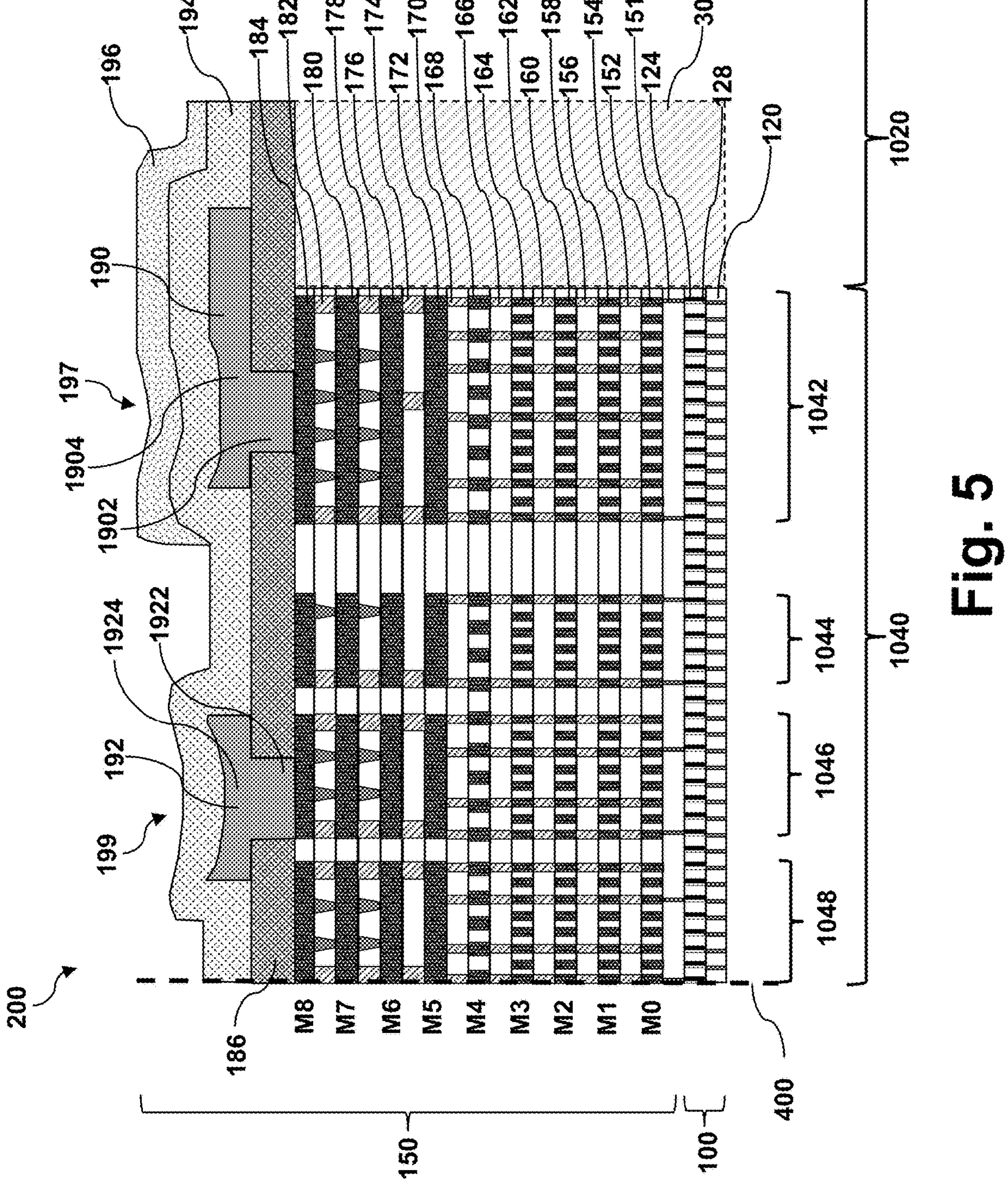
FIG. 5 illustrates an enlarged fragmentary cross-sectional view of a portion of the interconnect structure disposed over a ring region of the substrate in FIG. 1, according to one or more aspects of the present disclosure.
Figure 6:
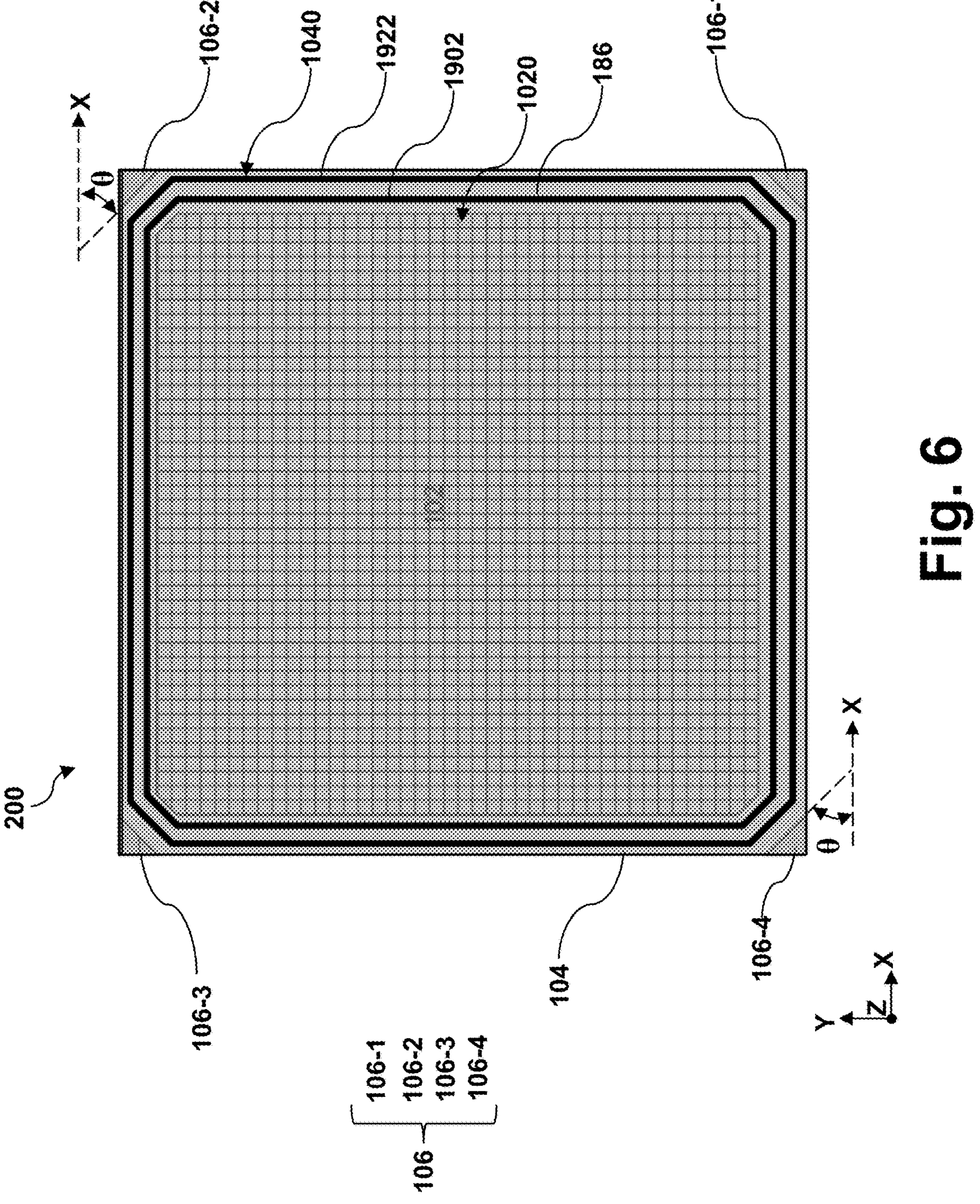
FIG. 6 illustrates a top view of the IC chip in FIG. 3 showing how example contact via rings are situated relative to other features of the IC chip, according to one or more aspects of the present disclosure.
Figure 7:
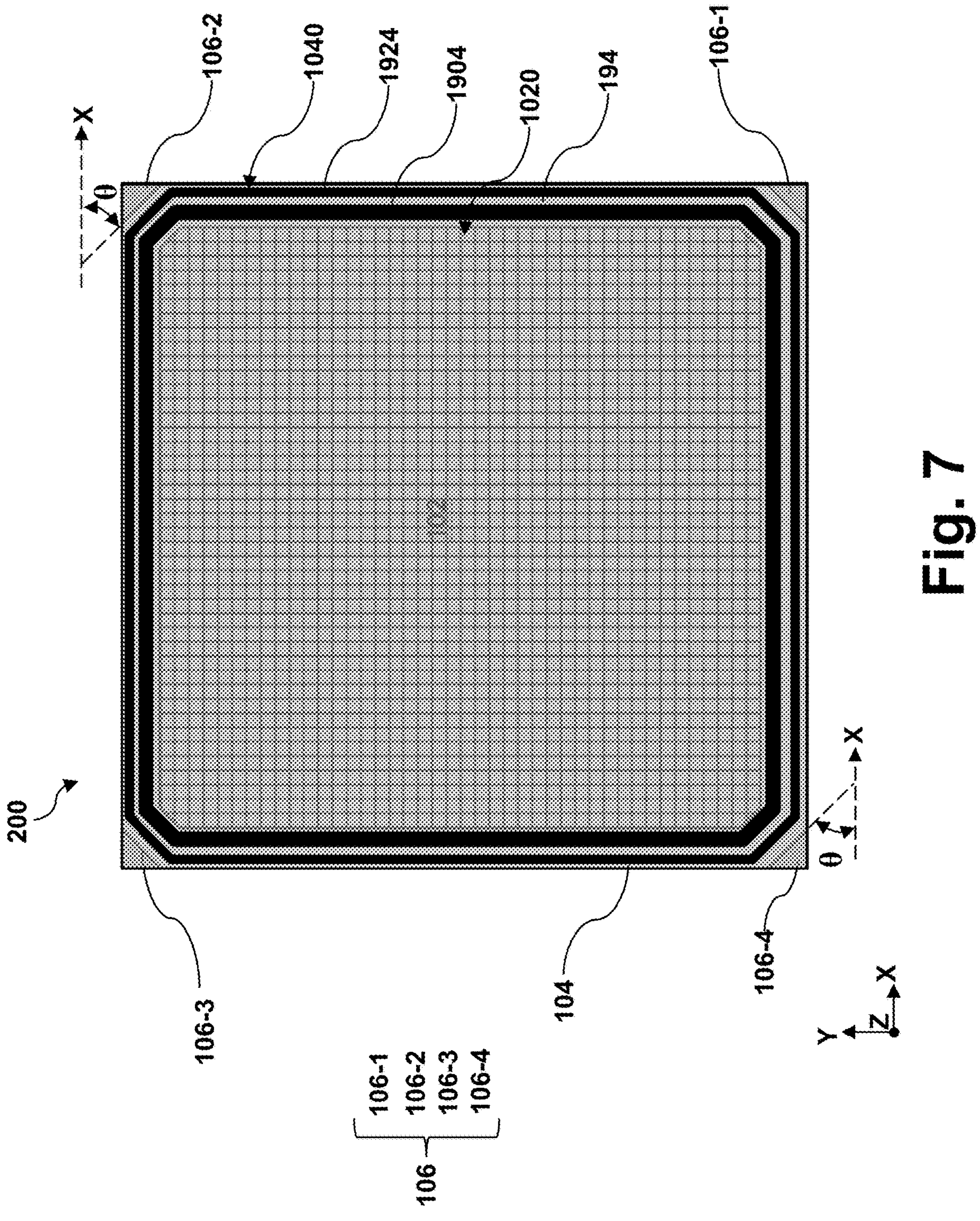
FIG. 7 illustrates a top view of the IC chip in FIG. 3 showing how example contact pad rings are situated relative to other features of the IC chip, according to one or more aspects of the present disclosure.
Figure 8:
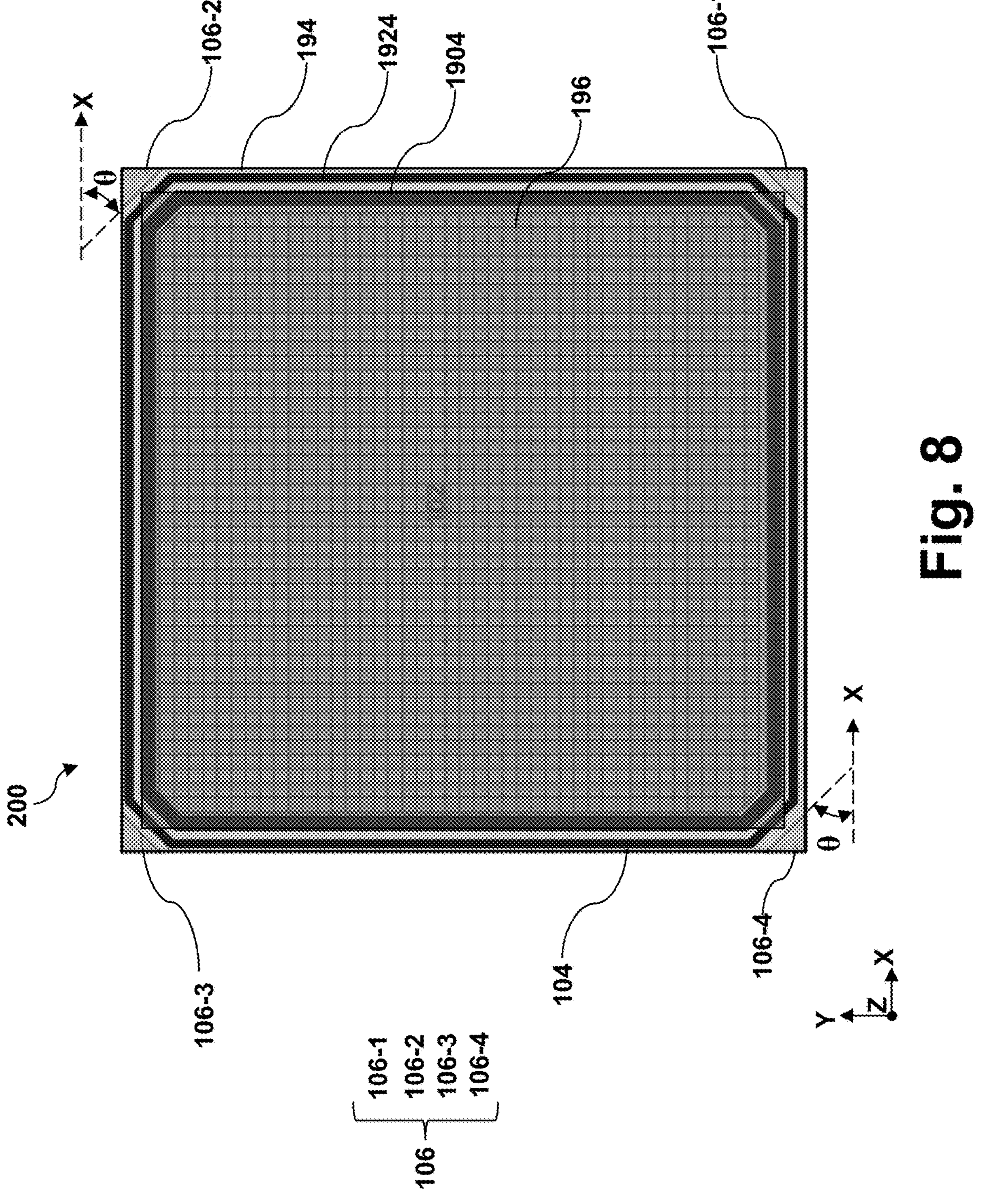
FIG. 8 illustrates a top view of the IC chip in FIG. 3 showing how an example polymer layer situated relative to other features of the IC chip, according to one or more aspects of the present disclosure.

FIG. 3 illustrates a top view of the IC chip 200, which includes the substrate 100 and the interconnect structure 150 disposed on the substrate 100. For illustration purposes, the interconnect structure 150 is illustrated as a see-though layer in FIG. 3. As shown in FIG. 3, the interconnect structure 150 covers the entirety of the substrate 100 and includes various portions vertically (i.e., along the Z direction) corresponding to various regions of the substrate 100. The interconnect structure 150 includes a first region 1020 directly over the device region 102 of the substrate 100 and a second region 1040 directly over the ring region 104 of the substrate 100. Various features of the interconnect structure 150 will be described in more detail below. A top view of a rectangular area that vertically covers the fourth corner area 106-4, a corner portion of the ring region 104 and a portion of the device region 102 is illustrated in FIG. 4. FIG. 5 illustrates a cross-sectional view across different parts of the second region 1040. FIGS. 6, 7 and 8 illustrate top views of the IC chip 200 to show how passivation structures and contact pad structures in the passivation structures are situated relative to the first region 1020 and the second region 1040. A rectangular area in the first region 1020 will be described in more details in conjunction with a top view shown in FIG. 9.

FIG. 4 illustrates a fragmentary top view of the rectangular area in a corner area of the second region 1040 of the interconnect structure 150 shown in FIG. 3. FIG. 4 shows the interconnect structure 150 directly over the fourth corner area 106-4, a corner portion of the ring region 104 and a portion of the device region 102. In other words, the rectangular area shown in FIG. 4 includes a corner portion of the first region 1020, a corner portion of the second region 1040, and a portion of the interconnect structure 150 directly over the fourth corner area 106-4. FIG. 5 illustrates a fragmentary cross-sectional view of the second region 1040 along any one of line A-A', line B-B' or line C-C' in FIG. 4. Line A-A' extends along the X direction, line B-B' extends along the Y direction, and line C-C' extends along a direction that forms an angle θ with either the X direction or the Y direction. In some embodiments, the angle θ may be about 45°. Because the second region 1040 has a closed-loop shape that goes completely around the first region 1020, the cross-sectional view of the second region 1040 is substantially the same along any one of line A-A', line B-B' or line C-C' in FIG. 4.

Reference is made to FIG. 5. The substrate 100 includes active regions 120, gate structures 124 and source/drain contacts 128. Each of the gate structures 124 is disposed over a channel region of an active region and each of the source/drain contacts 128 is disposed over a source/drain feature that is disposed over a source/drain region of an active region. The second region 1040 of the interconnect structure 150 may include 9 to 14 metal layers embedded in intermetal dielectric (IMD) layers. In the depicted embodiments, the interconnect structure 150 includes nine metal layers—a first metal layer M0, a second metal layer M1, a third metal layer M2, a fourth metal layer M3, a fifth metal layer M4, a sixth metal layer M5, a seventh metal layer M6, an eighth metal layer M7, and a ninth metal layer M8. In the second region 1040, each of the metal layers include one or more metal lines, one or more via bars, or one or more vias. As shown in FIG. 5, the first metal layer M0 include a plurality of first metal lines 152, the second metal layer M1 includes a plurality of second metal lines 156, the third metal layer M2 includes a plurality of third metal lines 160, the fourth metal layer M3 includes a plurality of fourth metal lines 164, the fifth metal layer M4 includes a plurality of fifth metal lines 168, the sixth metal layer M5 includes a plurality of sixth metal lines 172, the seventh metal layer M6 includes a plurality of seventh metal lines 176, the eighth metal layer M7 includes a plurality of eighth metal lines 180, and the ninth metal layer M8 includes a plurality of ninth metal lines 184. In the second region 1040, each of the metal lines in each metal layer goes completely around to form a closed loop that surround the first region 1020. Namely, the second region 1040 may be considered part of a ring structure that protects the device region 102 and the first region 1020.

In the second region 1040, the metal layers are arranged to form a plurality of seal ring walls. In the depicted embodiment, the second region 1040 includes a first seal ring wall 1042, a second seal ring wall 1044, a third seal ring wall 1046, and a fourth seal ring wall 1048. The first seal ring wall 1042, the second seal ring wall 1044, the third seal ring wall 1046, and the fourth seal ring wall 1048 extend continuously along the second region 1040 to go completely around the first region 1020. That is, the first seal ring wall 1042 surrounds the first region 1020, the second seal ring wall 1044 surrounds the first seal ring wall 1042, the third seal ring wall 1046 surrounds the second seal ring wall 1044, and the fourth seal ring wall 1048 surrounds the third seal ring wall 1046. Each of the first seal ring wall 1042, the second seal ring wall 1044, the third seal ring wall 1046, and the fourth seal ring wall 1048 is formed of metal lines and via bars in the metal layers. Each of the first seal ring wall 1042, the second seal ring wall 1044, the third seal ring wall 1046, and the fourth seal ring wall 1048 includes an inner wall surface closer to the first region 1020 and an outer wall surface away from the first region 1020. Each of the inner wall surfaces and the outer wall surfaces includes at least one innermost via bars disposed directly over at least one innermost metal lines in any of the metal layers. As used herein, a via bar is disposed vertically between two metal lines in two adjacent metal layers and extends lengthwise completely around in a closed loop that surrounds the first region 1020. As shown in FIG. 5, the first metal layer M0 includes first via bars 151, the second metal layer M1 includes second via bars 154, the third metal layer M2 includes third via bars 158, the fourth metal layer M3 includes fourth via bars 162, the fifth metal layer M4 includes fifth via bars 166, the sixth metal layer M5 includes sixth via bars 170, the seventh metal layer M6 includes seventh via bars 174, the eighth metal layer M7 includes eighth via bars 178, and the ninth metal layer M8 includes ninth via bars 182. As shown in FIG. 5, the via bars are disposed vertically between two metal lines in different metal layers.

The first seal ring wall 1042 includes an inner wall surface formed by vertically aligned innermost metal lines and innermost via bars and an outer wall surface formed by vertically aligned outermost metal lines and outermost via bars. The second seal ring wall 1044 includes an inner wall surface formed by vertically aligned innermost metal lines and innermost via bars and an outer wall surface formed by vertically aligned outermost metal lines and outermost via bars. The third ring wall 1046 includes an inner wall surface formed by vertically aligned innermost metal lines and innermost via bars and an outer wall surface formed by vertically aligned outermost metal lines and outermost via bars. The fourth seal ring wall 1048 includes an inner wall surface formed by vertically aligned innermost metal lines and innermost via bars and an outer wall surface formed by vertically aligned outermost metal lines and outermost via bars. As shown in FIG. 5, the boundaries of each of the first seal ring wall 1042, the second seal ring wall 1044, the third seal ring wall 1046, and the fourth seal ring wall 1048 are defined by the inner wall surface and the outer wall surface. That said, in some embodiments, a seal ring wall may be spaced apart from an adjacent seal ring wall by a pattern-free zone that is filled with IMD layers without any metal lines, vias, or via bars.

In the depicted embodiment, the first seal ring wall 1042 is closer to the first region 1020 and the fourth seal ring wall 1048 is closer to a scribe line 400. The scribe line 400 is where a die saw cutting is performed during the singulation process of the IC chip 200. For brevity, the metal layers in the first region 1020 are collectively referred to as metal layers 300 and are not illustrated in as much detail as the metal layers in the second region 1040. Unlike the second region 1040, the first region 1020 does not include seal ring walls or via bars. None of the metal lines in the first region 1020 extends continuously around to form a closed loop.

The interconnect structure 150 includes a first passivation layer 186 disposed over the topmost metal layer, at least one contact via ring embedded in the first passivation layer 186, at least one contact pad ring disposed over the first passivation layer 186 and the at least one contact via ring, a second passivation layer 194 disposed over the at least one contact pad ring and the first passivation layer 186, and a polymer layer 196 over the second passivation layer 194. In the depicted embodiments, the topmost metal layer is the ninth metal layer M8 that includes an IMD layer and ninth metal lines 184 embedded in the IMD layer. The first passivation layer 186 is disposed on the IMD layer and the ninth metal lines 184 in the ninth metal layer M8. In the embodiments represented in FIG. 5, the IC chip 200 includes a first contact via ring 1902 and a second contact via ring 1922. The first contact via ring 1902 vertically extends through the first passivation layer 186 to couple to one of the ninth metal lines 184 on top of the first seal ring wall 1042. The second contact via ring 1922 vertically extends through the first passivation layer 186 to couple to one of the ninth metal lines 184 on top of the third seal ring wall 1046. A first contact pad ring 1904 is disposed on the first passivation layer 186 and the first contact via ring 1902. A second contact pad ring 1924 is disposed on the first passivation layer 186 and the second contact via ring 1922. In some embodiments, a contact pad ring and a corresponding contact via ring may be formed by depositing a metal fill layer in a dual damascene opening. In these embodiments, the contact pad ring and the underlying contact via ring are continuous without an observable interface. In the depicted embodiment, the first contact pad ring 1904 and the underlying first contact via ring 1902 are different portions of a first pad structure 190 and the second contact pad ring 1924 and the underlying second contact via ring 1922 are different portions of a second pad structure 192. An observable interface may not be present between the first contact via ring 1902 and the first contact pad ring 1902 or between the second contact via ring 1922 and the second contact pad ring 1924. Deposition of the metal fill layer in a dual damascene opening tend to form a groove or a depression right over the lower via opening where the contact via ring is formed. As shown in FIG. 5, the first contact pad ring 1904 includes a first groove 197 right over the first contact via ring 1902 and the second contact pad ring 1924 includes a second groove 199 right over the second contact via ring 1922. As the first pad structure 190 and the second pad structure 192 both go around the first region 1020 to form closed loops, so do the first groove 197 and the second groove 199. Both the first groove 197 and the second groove 199 go around the first region 1020. The second passivation layer 194 and the polymer layer 196 that are deposited over the first groove 197 and/or second groove 199 may also include depression rings corresponding to the first groove 197 and/or the second groove 199.

In some embodiments, the first passivation layer 186 and the second passivation layer 194 may include undoped silicate glass (USG), silicon nitride, silicon oxide, or silicon oxynitride. The first contact via ring 1902, the first contact pad ring 1904, the second contact via ring 1922, and the second contact pad ring 1924 may include aluminum (Al), copper (Cu), aluminum-copper (Al—Cu), a suitable metal, or a suitable metal alloy. The polymer layer 196 may include epoxy, polyimide (PI), benzocyclobutene (BCB), or polybenzoxazole (PBO). In one embodiment, the polymer layer 196 includes polyimide (PI).

The first pad structure 190 and the second pad structure 192 extend continuously around the first region 1020 to form closed loops. Reference is made to FIG. 6, which illustrates a top view of the IC chip 200 at the level of the first contact via ring 1902 and the second contact via ring 1922. As shown in FIG. 6, both the first contact via ring 1902 and the second contact via ring 1922 are embedded in the first passivation layer 186. Both the first contact via ring 1902 and the second contact via ring 1922 extend continuously around the first region 1020 to form closed loops. Each of the first contact via ring 1902 and the second contact via ring 1922 is substantially rectangular. Reference is then made to FIG. 7, which illustrates a top view of the IC chip 200 at the level of the first contact pad ring 1904 and the second contact pad ring 1924. As shown in FIG. 7, both the first contact pad ring 1904 and the second contact pad ring 1924 are embedded in the second passivation layer 194. Both the first contact pad ring 1904 and the second contact pad ring 1924 extend continuously around the first region 1020 to form closed loops. Each of the first contact pad ring 1904 and the second contact pad ring 1924 is substantially rectangular.

Referring back to FIG. 4, the first contact pad ring 1904 of the first pad structure 190 has a first width W1 along a direction perpendicular to its lengthwise direction. For example, when the first contact pad ring 1904 extends along the Y direction, the first width W1 is measured along the X direction. Similarly, the second contact pad ring 1924 of the second pad structure 192 has a second width W2 along a direction perpendicular to its lengthwise direction. The first width W1 and the second width W2 may be between about 2 μm and about 10 μm. In the depicted embodiment, the first width W1 is greater than the second width W2. In some instances, the first width W1 is between about 6 μm and about 10 μm and the second width W2 is between about 2 μm and about 6 μm. In embodiments where the first width W1 is greater than the second width W2, the second pad structure 192 is closer to the scribe line 400 and is more susceptible to damages. Having the wider first pad structure 190 closer the first region 1020 provides better protection against stress generated during the singulation process, including the stress or strain generated when the narrower second pad structure 192 is damaged.

As shown in FIGS. 4 and 5, the polymer layer 196 is only disposed on an inner portion of the second passivation layer 194 but not on an outer portion of the second passivation layer 194. That is, boundaries of the polymer layer 196 do not extend all the way out to meet boundaries of the second passivation layer 194 or boundaries of the IC chip 200. Referring to FIG. 4, the polymer layer 196 covers the first region 1020 but does not fully cover the second region 1040. In the depicted embodiment, the polymer layer 196 completely overlap the first pad structure 190 vertically but does not fully overlap the second pad structure 192. This arrangement is not trivial. Experiments indicate that when the polymer layer 196 is present at or near the scribe line 400 (shown in FIG. 5), cutting of the polymer layer 196 would generate undesirable debris species that may cause contamination. To avoid generation of such debris species, the edges of the polymer layer 196 are intentionally pushed back from the edges of the IC chip 200, away from the scribe line. The area covered by the polymer layer 196 is substantially rectangular. As indicated by the double-sided arrows, an area of the polymer layer 196 may be adjusted to be smaller or larger. In some embodiments represented in FIG. 4, the polymer layer 196, or a corner portion 1960 thereof, vertically overlaps a portion of the second pad structure 192. In some other embodiments not explicitly shown, the polymer layer 196 may have a smaller coverage and does not vertically overlap any portion of the second pad structure 192. The vertical coverage of the polymer layer 196 is also illustrated in FIG. 8. The edges of the polymer layer 196 is spaced apart from all edges of the IC chip 200, which coincide with edges of the second passivation layer 194. The polymer layer 196 completely covers the first region 1020 such that the device region 102 is completely covered by the polymer layer 196. In at least some embodiments, the polymer layer 196 does not vertically overlap the corner areas 106, which include the first corner area 106-1, the second corner area 106-2, the third corner area 106-3, and the fourth corner area 106-4.

As shown in FIG. 9, the first region 1020 does not include any contact pad rings or contact via rings. Instead, the first region 1020 includes a plurality of contact pads 188, each of which is electrically coupled to at least one conductive line in the topmost metal layer in the interconnect structure 150 by way of at least one top via 187. The plurality of contact pads 188 may be rectangular, L-shaped, or step-shaped. From a top view, the top vias 187 may be substantially square or rectangular. None of the top vias 187 or the contact pads 188 in the first region 1020 extends a full circle to form a closed-loop shape. The top vias 187 are embedded in the first passivation layer 186 and the contact pads 188 are embedded in the second passivation layer 194. Similar to the first pad structure 190 and the second pad structure 192, a contact pad 188 and corresponding top via(s) 187 may be formed from a metal fill layer deposited in a dual damascene opening. In those instances, the contact pad 188 and the underlying top via(s) 187 may be continuous and do not include any observable interface in between. The plurality of contact pads 188 may have a third width W3. The third width W3 is smaller than the first width W1 or the second width W2. In some instances, the third width may be between about 1 μm and about 2 μm. A ratio of the first width W1 or the second width W2 to the third width W3 may be between about 2 and about 4.

In one exemplary aspect, the present disclosure is directed to an integrated circuit (IC) chip. The IC chip includes a substrate that has a device region and a ring region surrounding the device region, an interconnect structure disposed on the substrate, a first passivation layer disposed over the interconnect structure, a first contact via ring embedded in the first passivation layer, a first contact pad ring disposed on the first contact via ring and the first passivation layer, a second passivation layer disposed over the first contact pad ring, and a polymer layer disposed on a portion of the second passivation layer. The first contact via ring and the first contact pad ring completely surround the device region.

In some embodiments, the interconnect structure includes a first seal ring wall disposed over the ring region, and a second seal ring wall disposed over the ring region and around the first seal ring wall. In some instances, the first contact via ring extends through the first passivation layer to contact a top metal layer of the first seal ring wall. In some implementations, the IC chip may further include a second contact via ring extending through the first passivation layer to contact a top metal layer of the second seal ring wall, and a second contact pad ring disposed on the second contact via ring and the first passivation layer. The second contact via ring and the second contact pad ring completely surround the device region. The second passivation layer is not disposed over the second contact pad ring. In some implementations, the first passivation layer and the second passivation layer include undoped silicate glass (USG), silicon nitride, silicon oxide, or silicon oxynitride. In some embodiments, the polymer layer includes epoxy, polyimide (PI), benzocyclobutene (BCB), or polybenzoxazole (PBO). In some instances, the first contact via ring and the first contact pad ring includes aluminum, copper, or aluminum-copper. In some implementations, the first contact pad ring includes a groove directly over the first contact via ring.

In another exemplary aspect, the present disclosure is directed to an IC chip. The IC chip includes a substrate having a device region and a ring region surrounding the device region, an interconnect structure disposed on the substrate and having a first region directly over the device region, and a second region directly over the ring region, a first passivation layer disposed over the interconnect structure, a plurality of contact pads disposed on the first passivation layer and directly over the first region, a first contact pad ring disposed on the first passivation layer and directly over the second region, a second passivation layer disposed over the plurality of contact pads and the first contact pad ring, and a polymer layer disposed on a portion of the second passivation layer. The first contact pad ring completely surrounds the second region.

In some embodiments, each of plurality of contact pads has a first width and the first contact pad ring has a second width greater than the first width. In some embodiments, a ratio of the second width to the first width is between about 2 and about 4. In some embodiments, the second region includes a first seal ring wall surrounding the first region in a closed loop, a second seal ring wall surrounding the first seal ring wall, a third seal ring wall surrounding the second seal ring wall, and a fourth seal ring wall surrounding the third seal ring wall. In some implementations, the IC chip further includes a first contact via ring extending through the first passivation layer to vertically couple the first contact pad ring and a top metal layer of the first seal ring wall. In some embodiments, the IC chip further includes a second contact pad ring disposed on the first passivation layer and surrounding the first contact via ring, a second contact via ring extending through the first passivation layer to vertically couple the second contact pad ring to a top metal layer of the third seal ring wall, and a second contact pad ring disposed on the second contact via ring and the first passivation layer. The second passivation layer is not disposed over the second contact pad ring. In some instances, the second contact pad ring includes a groove directly over the first contact via ring.

In yet another exemplary aspect, the present disclosure is directed to an IC chip. The IC chip includes a substrate having a device region and a ring region surrounding the device region, an interconnect structure disposed on the substrate and having a first region directly over the device region, and a second region directly over the ring region, a first passivation layer disposed over the interconnect structure, a second passivation layer disposed over the first passivation layer, and a polymer layer disposed on an inner portion of the second passivation layer but not on an outer portion of the second passivation layer. The outer portion of the second passivation layer vertically overlaps the second region.

In some embodiments, the first passivation layer and the second passivation layer include undoped silicate glass (USG), silicon nitride, silicon oxide, or silicon oxynitride. The polymer layer includes epoxy, polyimide (PI), benzocyclobutene (BCB), or polybenzoxazole (PBO). In some instances, the IC chip may further include a first contact via ring embedded in the first passivation layer, a first contact pad ring disposed on the first contact via ring and the first passivation layer, a second contact via ring embedded in the first passivation layer, and a second contact pad ring disposed on the first passivation layer and the second contact via ring. The second contact pad ring surrounds the first contact pad ring. In some instances, the inner portion completely overlaps the first contact pad ring vertically. In some embodiments, the inner portion does not overlap at least a portion of the second contact pad ring vertically.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) chip, comprising:

a substrate comprising:

a device region, a ring region surrounding the device region, and four corner regions disposed at outer corners of the ring region;

an interconnect structure disposed on the substrate;

a first passivation layer disposed over the interconnect structure;

a first contact via ring embedded in the first passivation layer;

a first contact pad ring disposed on the first contact via ring and the first passivation layer;

a second passivation layer disposed over the first contact pad ring; and a polymer layer disposed on a portion of the second passivation layer, wherein the first contact via ring and the first contact pad ring completely surround the device region, wherein the polymer layer comprises a depression ring and the depression ring is disposed over the first contact pad ring, wherein, in a top view, the first contact pad ring comprises four cut-off corners corresponding to the four corner regions, wherein the polymer layer comprises a rectangular shape in a top view such that the polymer layer does not vertically overlap the four corner regions, wherein the interconnect structure comprises a first seal ring wall disposed over the ring region, wherein the first seal ring wall includes an inner wall surface and an outer wall surface, wherein the inner wall surface includes vertically aligned innermost metal lines and innermost via bars, and wherein the outer wall surface includes vertically aligned outermost metal lines and outermost via bars.

2. The IC chip of claim 1, wherein the interconnect structure further comprises:

a second seal ring wall disposed over the ring region and around the first seal ring wall.

3. The IC chip of claim 2, wherein the first contact via ring extends through the first passivation layer to contact a top metal layer of the first seal ring wall.

4. The IC chip of claim 3, further comprising:

a second contact via ring extending through the first passivation layer to contact a top metal layer of the second seal ring wall; and a second contact pad ring disposed on the second contact via ring and the first passivation layer, wherein the second contact via ring and the second contact pad ring completely surround the device region, and wherein a corner of the polymer layer vertically overlaps with a portion of the second contact pad ring.

5. The IC chip of claim 1, wherein the first passivation layer and the second passivation layer comprise undoped silicate glass (USG), silicon nitride, silicon oxide, or silicon oxynitride.

6. The IC chip of claim 1, wherein the polymer layer comprises epoxy, polyimide (PI), benzocyclobutene (BCB), or polybenzoxazole (PBO).

7. The IC chip of claim 1, wherein the first contact via ring and the first contact pad ring comprises aluminum, copper, or aluminum-copper.

8. The IC chip of claim 1, wherein the first contact pad ring comprises a groove directly over the first contact via ring.

9. An integrated circuit (IC) chip, comprising:

a substrate comprising:

a device region, a ring region surrounding the device region, and four corner regions disposed at outer corners of the ring region;

an interconnect structure disposed on the substrate and comprising:

a first region directly over the device region, and a second region directly over the ring region;

a first passivation layer disposed over the interconnect structure;

a plurality of contact pads disposed on the first passivation layer and directly over the first region;

a first contact pad ring disposed on the first passivation layer and directly over the second region;

a second passivation layer disposed over the plurality of contact pads and the first contact pad ring; and a polymer layer disposed on a portion of the second passivation layer, wherein the polymer layer comprises a depression ring and the depression ring is disposed over the first contact pad ring, wherein the polymer layer comprises a rectangular shape in a top view such that the polymer layer does not vertically overlap the four corner regions, wherein, in the top view, the first contact pad ring comprises four cut-off corners corresponding to the four corner regions, wherein the polymer layer completely overlaps the first contact pad ring, wherein the second region comprises a first seal ring wall surrounding the device region in a closed loop, wherein the first seal ring wall includes an inner wall surface and an outer wall surface, wherein the inner wall surface includes innermost metal lines and innermost via bars, wherein innermost sidewalls of the innermost metal lines and the innermost via bars are vertically aligned, wherein the outer wall surface includes outermost metal lines and outermost via bars, and wherein outermost sidewalls of the outermost metal lines and the outermost via bars are vertically aligned.

10. The IC chip of claim 9, wherein each of plurality of contact pads comprises a first width, and wherein the first contact pad ring comprises a second width greater than the first width.

11. The IC chip of claim 10, where a ratio of the second width to the first width is between about 2 and about 4.

12. The IC chip of claim 9, wherein second region further comprises:

a second seal ring wall surrounding the first seal ring wall;

a third seal ring wall surrounding the second seal ring wall; and a fourth seal ring wall surrounding the third seal ring wall.

13. The IC chip of claim 12, further comprising:

a first contact via ring extending through the first passivation layer to vertically couple the first contact pad ring and a top metal layer of the first seal ring wall.

14. The IC chip of claim 13, further comprising:

a second contact pad ring disposed on the first passivation layer and surrounding the first contact via ring; and a second contact via ring extending through the first passivation layer to vertically couple the second contact pad ring to a top metal layer of the third seal ring wall, wherein a corner of the polymer layer overlaps with a portion of the second contact pad ring.

15. The IC chip of claim 14, wherein the second contact pad ring comprises a groove directly over the second contact via ring.

16. An integrated circuit (IC) chip, comprising:

a substrate comprising:

a device region, a ring region surrounding the device region, and four corner regions disposed at outer corners of the ring region;

an interconnect structure disposed on the substrate and comprising:

a first region directly over the device region, and a second region directly over the ring region;

a first passivation layer disposed over the interconnect structure;

a second passivation layer disposed over the first passivation layer;

a first contact via ring embedded in the first passivation layer;

a first contact pad ring disposed on the first contact via ring and the first passivation layer; and a polymer layer disposed on an inner portion of the second passivation layer but not on an outer portion of the second passivation layer, wherein the polymer layer comprises a depression ring and the depression ring is disposed over the first contact pad ring, wherein the outer portion of the second passivation layer vertically overlaps the second region, wherein the polymer layer comprises a rectangular shape in a top view such that the polymer layer does not vertically overlap the four corner regions, wherein, in the top view, the first contact pad ring comprises four cut-off corners corresponding to the four corner regions, wherein the polymer layer completely overlaps the first contact pad ring, wherein the second region comprises a first seal ring wall, wherein the first seal ring wall includes an inner wall surface and an outer wall surface, wherein the inner wall surface includes innermost metal lines and innermost via bars, wherein innermost sidewalls of the innermost metal lines and the innermost via bars are vertically aligned, wherein the outer wall surface includes outermost metal lines and outermost via bars, and wherein outermost sidewalls of the outermost metal lines and the outermost via bars are vertically aligned.

17. The IC chip of claim 16, wherein the first passivation layer and the second passivation layer comprise undoped silicate glass (USG), silicon nitride, silicon oxide, or silicon oxynitride, and wherein the polymer layer comprises epoxy, polyimide (PI), benzocyclobutene (BCB), or polybenzoxazole (PBO).

18. The IC chip of claim 16, further comprising:

a second contact via ring embedded in the first passivation layer; and a second contact pad ring disposed on the first passivation layer and the second contact via ring, wherein the second contact pad ring surrounds the first contact pad ring, and wherein a corner of the polymer layer vertically overlaps a portion of the second contact pad ring.

19. The IC chip of claim 18, wherein the inner portion completely overlaps the first contact pad ring vertically, wherein the first contact pad ring is disposed over the first seal ring wall, and wherein an edge of the first contact pad ring extends beyond the inner wall surface.

20. The IC chip of claim 18, wherein the inner portion does not overlap at least a portion of the second contact pad ring vertically.

* * * * *